United States Patent
Yadav et al.

(10) Patent No.: US 10,831,611 B2
(45) Date of Patent: Nov. 10, 2020

(54) METHOD AND SYSTEM FOR EFFICIENT REPLICATION OF BLOCK-BASED BACKUPS

(71) Applicant: EMC IP Holding Company LLC, Hopkinton, MA (US)

(72) Inventors: Sunil Yadav, Bangalore (IN); Manjunath Jagannatha, Bangalore (IN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/259,431

(22) Filed: Jan. 28, 2019

(65) Prior Publication Data

US 2020/0241973 A1    Jul. 30, 2020

(51) Int. Cl.
| | | |
|---|---|---|
| *G06F 11/14* | (2006.01) | |
| *H03M 7/30* | (2006.01) | |
| *G06F 16/27* | (2019.01) | |
| *G06F 16/174* | (2019.01) | |

(52) U.S. Cl.
CPC ...... *G06F 11/1464* (2013.01); *G06F 11/1453* (2013.01); *G06F 11/1469* (2013.01); *G06F 16/1744* (2019.01); *G06F 16/27* (2019.01); *H03M 7/30* (2013.01)

(58) Field of Classification Search
CPC .................. G06F 11/1448; G06F 16/1744
See application file for complete search history.

(56) References Cited

U.S. PATENT DOCUMENTS 9,996,429 B1    6/2018 Kumar et al.
2018/0300205 A1*  10/2018 Sehgal ............... G06F 11/1469

OTHER PUBLICATIONS

Strome, David, "Understanding Exchange 2013 page zeroing", dated Dec. 8, 2016, retrieved from: https://docs.microsoft.com/en-us/exchange/understanding-exchange-2013-page-zeroing-exchange-2013-help (6 pages).

* cited by examiner

*Primary Examiner* — Edward J Dudek, Jr.
(74) *Attorney, Agent, or Firm* — Chamberlain, Hrdlicka, White, Williams & Aughtry

(57) ABSTRACT

A method for managing backups includes mounting a block-based backup on a backup storage system to obtain a mounted backup, compressing the mounted backup to generate a compressed backup, and replicating the compressed backup to generate a plurality of compressed backups.

17 Claims, 8 Drawing Sheets

METHOD AND SYSTEM FOR EFFICIENT REPLICATION OF BLOCK-BASED BACKUPS

BACKGROUND

Computing devices generate and storage large amounts of data. Over time, the data that is stored may be transferred to a remote storage system. Depending on how the data is initially stored by the computing device, it may be difficult to efficiently manage this stored data and the transfer of the stored data to the remote storage system.

SUMMARY

In general, in one aspect, the invention relates to a method for managing backups in accordance with one or more embodiments of the invention. The method includes mounting a block-based backup on a backup storage system to obtain a mounted backup, compressing the mounted backup to generate a compressed backup, and replicating the compressed backup to generate a plurality of compressed backups.

In one aspect, a non-transitory computer readable medium in accordance with one or more embodiments of the invention includes computer readable program code, which when executed by a computer processor enables the computer processor to perform a method for managing backups. The method includes mounting a block-based backup on a backup storage system to obtain a mounted backup, compressing the mounted backup to generate a compressed backup, and replicating the compressed backup to generate a plurality of compressed backups.

In one aspect, a system for managing backups in accordance with one or more embodiments of the invention includes a processor, a database, and memory comprising instructions which when executed by the processor perform a method. The method includes mounting a block-based backup on the system to obtain a mounted backup, compressing the mounted backup to generate a compressed backup, and replicating the compressed backup to generate a plurality of compressed backups.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N unless otherwise specified. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention relate to systems and methods for performing a backup. More specifically, embodiments of the invention generate a block-based backup of one or more files by generating an empty copy of a source volume in which the files are stored, identifying extents associated with the files, and sending the empty copy along with the identified file extents to a backup storage device.

Further, embodiments of the invention relate to systems and methods for mounting the block-based backup to the backup storage device and compressing the backup at a file level. During recovery, the compressed backup may be mounted on the production host, decompressed, and restored to a useable format.

Figure 1:
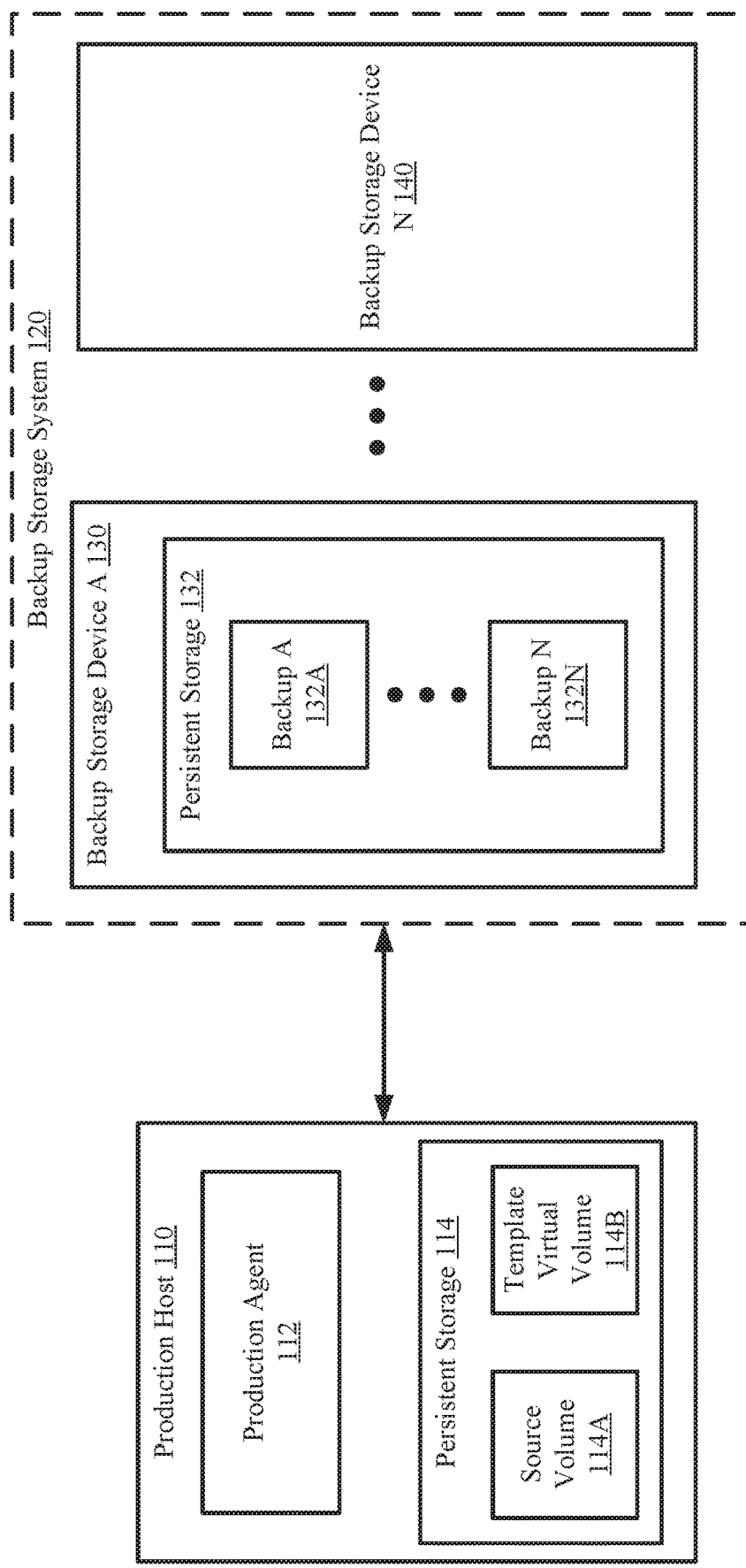
FIG. 1 shows a diagram of a system in accordance with one or more embodiments of the invention.

FIG. 1 shows a diagram of a system in accordance with one or more embodiments of the invention. The system may include a production host (110) and a backup storage system (120). The backup storage system (120) may include one or more backup storage devices (130, 140). The production host may include a production agent (112) and persistent storage (114). A backup storage device (130) may include persistent storage (132). Each component of the system of FIG. 1 may be operably connected via any combination of wired and/or wireless connections. Each component of the system is discussed below.

In one or more embodiments of the invention, the production host (110) includes functionality for generating a source volume (114A) (defined below) and to perform all or a portion of the method shown in FIGS. 2A-2D in order to transfer backups of files (or portions thereof) to the backup storage device (130) and/or to recover the backups from the backup storage device (130).

In one or more embodiments of the invention, the production agent (112) includes functionality for generating a backup of the source volume (114A) to be sent to the backup storage device (130). The production agent (112) may generate the backup by generating a template volume (114B) using the source volume (114A) and identifying the data to be sent to a backup storage device (130) for backup. In one or more embodiments of the invention, the production agent (112) generates the backup by performing the methods of FIGS. 2A-2C.

In one or more embodiments of the invention, the production agent is implemented as computer instructions, e.g. computer code, stored on a persistent storage that when executed by a processor of the production host (110) causes the production host (110) to provide the functionality of the production agent (110) described throughout this application and/or all, or a portion thereof, of the methods illustrated in FIGS. 2A-2D.

In one or more embodiments of the invention, the persistent storage (114) is a storage device that stores data structures. The persistent storage (114) may be a physical or virtual device. For example, the persistent storage (114) may include solid state drives, solid state drives, tape drives, and other components to provide data storage functionality. Alternatively, the persistent storage (114) may be a virtual device that utilizes the physical computing resources of other components to provide data storage functionality.

In one or more embodiments of the invention, the persistent storage (114) includes a source volume (114A) and a template virtual volume (114B). The persistent storage may include additional, fewer, and/or different data structures without departing from the invention. Each data structure of the persistent storage (114) is discussed below.

In one or more embodiments of the invention, the source volume (114A) is a data structure that includes data generated by the production host (110). The data may be, for example, one or more files.

In one or more embodiments of the invention, the template virtual volume is a copy of a portion of data included in the source volume (114A). The portion of data may be a subset of the files (e.g., one or more of the files) stored in the source volume (114A). The subset of files may be backed up using the template virtual volume. In one or more embodiments of the invention, the template virtual volume (114B) does not store data associated with the subset of files. Rather, the template virtual volume (114B) includes an empty volume with a size identical to that of the source volume (114A). In other words, the template virtual volume (114B) may take up the same amount of space as the source volume (114A) and include information about the subset of files, but not include any of file data from the source volume (114A). The information may be a region in the template virtual volume (114B) that is designated to the subset of files. During a backup operation, the production agent (112) may read portions of the template virtual volume (114B) and use the designated region to determine the data to be sent to the backup storage device (130).

Figure 4:
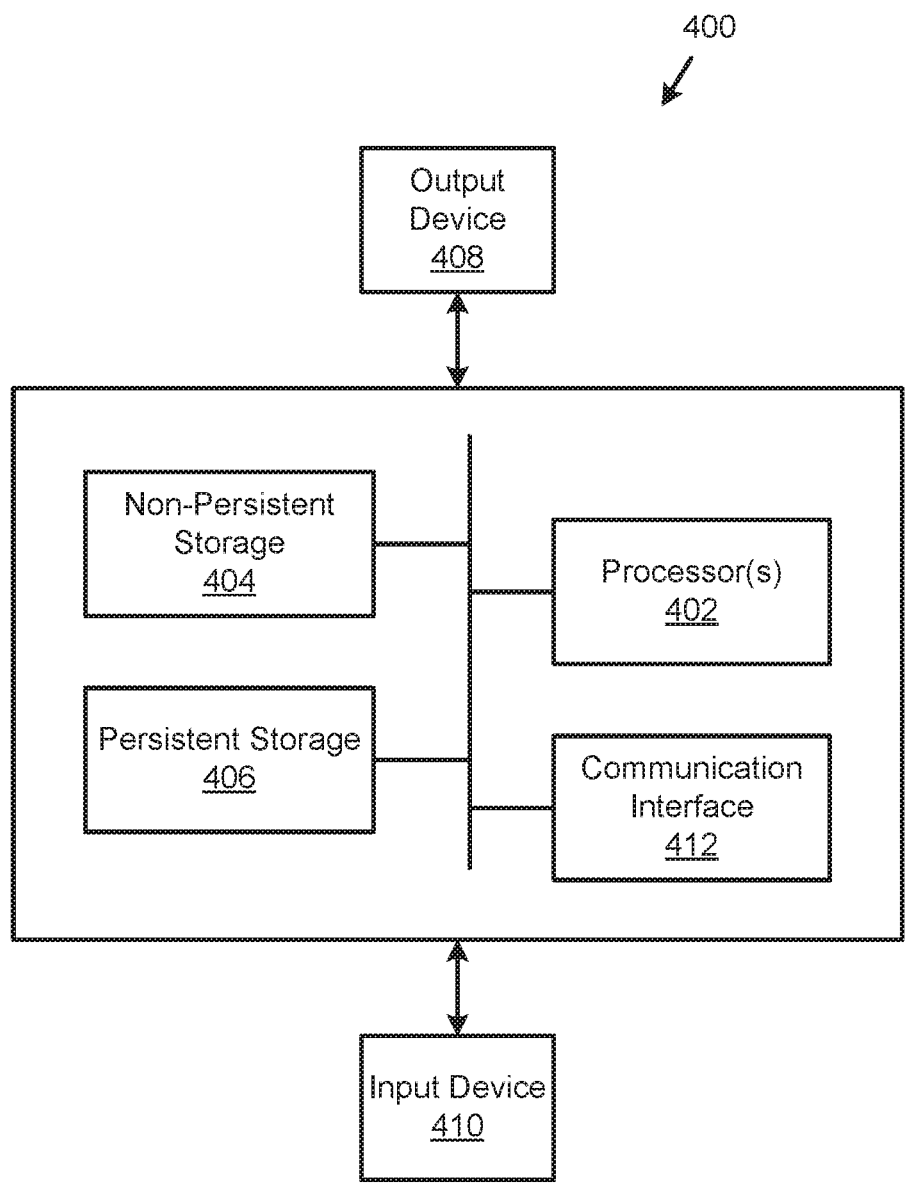
FIG. 4 shows a diagram of a computing device in accordance with one or more embodiments of the invention.

In one or more embodiments of the invention, the production host (110) may be a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the production host (110) described throughout this application and/or all, or a portion thereof, of the methods illustrated in FIGS. 2A-2D.

In one or more embodiments of the invention, the production host (110) is implemented as a logical device. The logical device may utilize the computing resources of any number of computing devices and thereby provide the functionality of the production host (110) described throughout this application and/or all, or a portion thereof, of the methods illustrated in FIGS. 2A-2D.

In one or more embodiments of the invention, the backup storage devices (130, 140) store one or more backups (122A, 122N) on a persistent storage (130). The backups (122A, 122N) may be data obtained from the production host (110), mounted on the backup storage device (130), and compressed.

In one or more embodiments of the invention, the data obtained from the production host (110) is a block-based backup. The block-based backup is obtained from a stream between the production host (110) and the backup storage device (130) that read blocks from disks storing data of the production host (110). The blocks read to the stream are determined based on methods illustrated in FIG. 2B.

In one or more embodiments of the invention, the backup storage device (130) may be a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the backup storage device (130) described throughout this application.

In one or more embodiments of the invention, the backup storage device (130) is implemented as a logical device. The logical device may utilize the computing resources of any number of computing devices and thereby provide the functionality of the backup storage device (130) described throughout this application.

While the various steps in the following flowcharts are presented and described sequentially, one of ordinary skill in the relevant art will appreciate that some or all of the steps may be executed in different orders, may be combined or omitted, and some or all steps may be executed in parallel. In one embodiment of the invention, the steps shown in FIGS. 2A-2D may be performed in parallel with any other steps shown in FIGS. 2A-2D without departing from the scope of the invention.

Figure 2A:
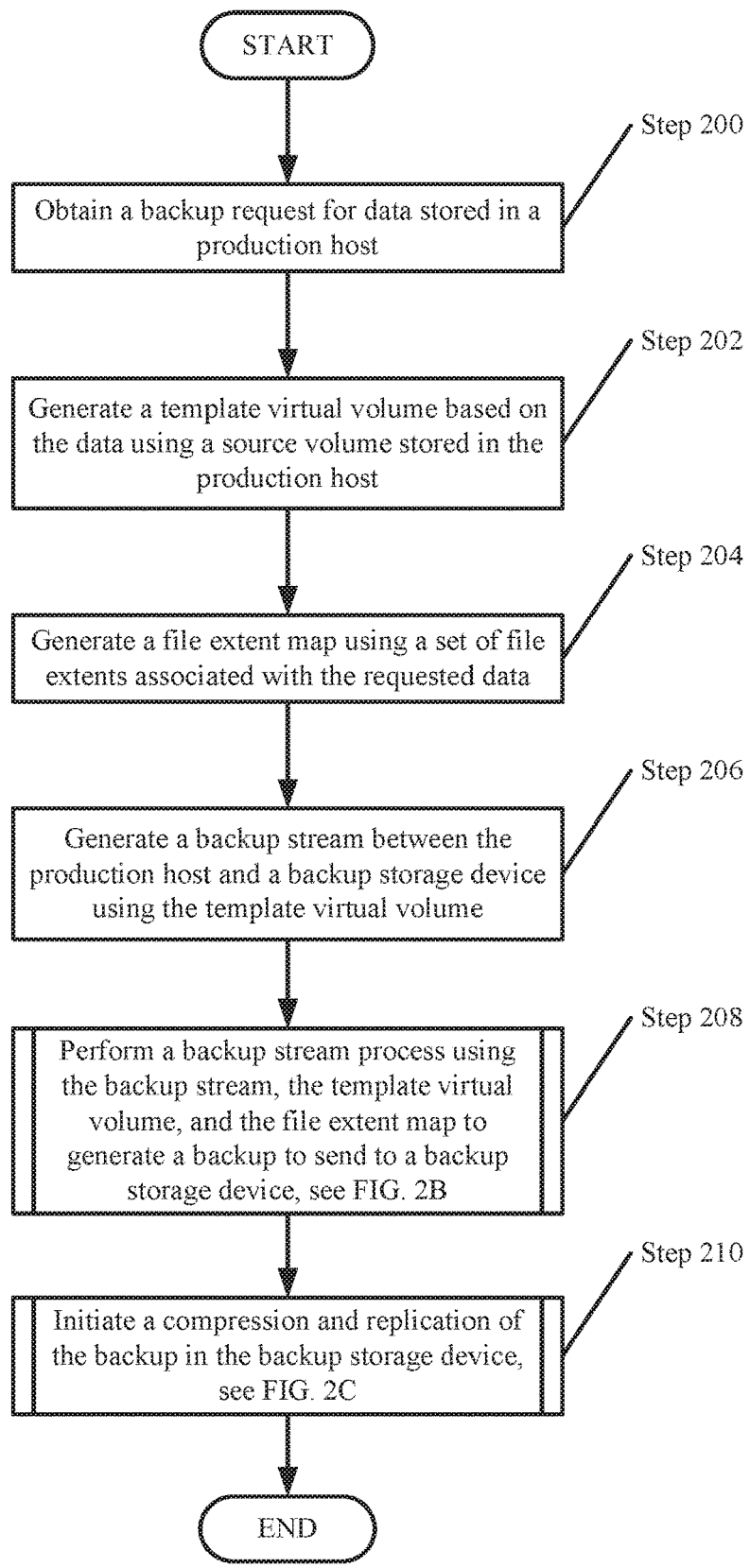
FIG. 2A shows a flowchart for transferring data from a production host to a backup storage device in accordance with one or more embodiments of the invention.

FIG. 2A shows a flowchart for transferring data from a production host to a backup storage device in accordance with one or more embodiments of the invention.

In step 200, a backup request for data stored in a production host is obtained. In one or more embodiments of the invention, the data includes a file, or a subset of files, to be backed up on a backup storage device.

In step 202, a template virtual volume is generated based on the data using a source volume stored in the production host. In one or more embodiments of the invention, the template virtual volume is generated by creating a virtual disk with a size identical to the total size of the files stored in the source volume, obtaining information about the subset of files (e.g. size of the files in the subset and offsets relative to the source volume in which the files are stored), and allocating a portion of the template virtual volume to the subset of files to be backed up. The portion allocated to the subset may be determined using the sizes and offsets of the subset of files.

In step 204, a file extent map is generated using a set of file extents associated with the requested data. In one or more embodiments of the invention, the file extent map is a data structure that specifies the file extents associated with the subset of files to be backed up. A file extent is a data structure that identifies a contiguous portion of a disk in which data associated with a file is stored. The file extent may include an offset and a range associated with the portion of the disk.

In step 206, a backup stream between the production host and the backup storage device is generated. The backup stream may be a series of file extents associated with data stored in the source volume.

In step 208, a backup stream process is performed using the backup stream, the template virtual volume, and the file extent map to generate a block-based backup to send to a backup storage device. The backup may be in a virtual hard disk (VHD/VHDX) format when sent to the backup storage device. The VHD/VHDX format may include data associated with the files to be backed up and metadata that describes the data. The backup may be generated by identifying and copying data blocks associated with the template virtual volume. The copies of the data blocks may be populated on a backup stream that is sent to the backup storage device as a block-based backup. Other formats may be used without departing from the invention.

Figure 2B:
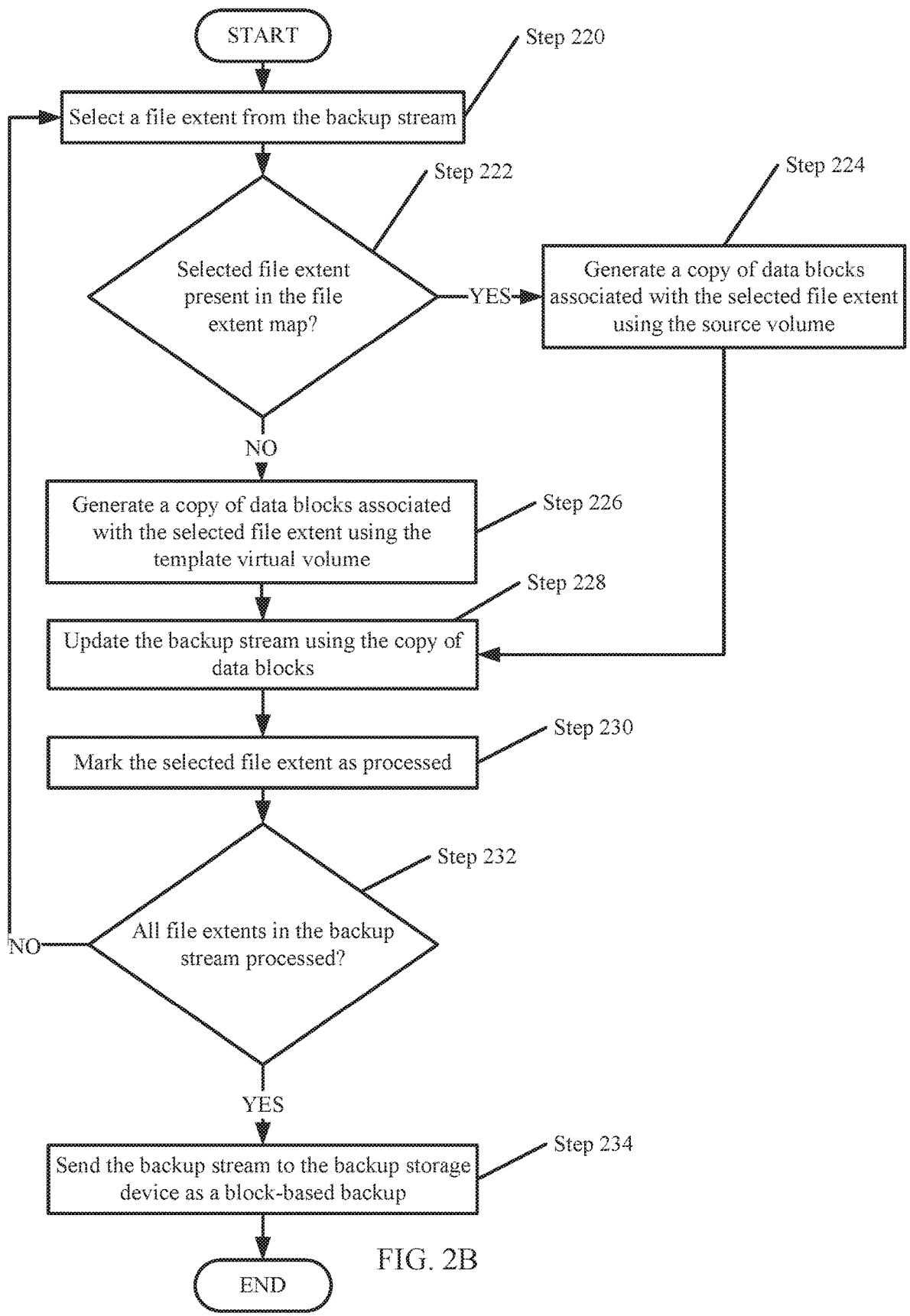
FIG. 2B shows a flowchart for performing a backup stream process in accordance with one or more embodiments of the invention.

In one or more embodiments of the invention, the backup stream process is performed via the methods of FIG. 2B. The backup stream process may be performed via other methods without departing from the invention.

In step 210, a compression and replication of the block-based backup is initiated. The compression and replication may be initiated by prompting the backup storage device receiving the block-based backup to compress the backup at a file-level. Compression at a file-level (discussed below) may result in a generated compressed backup. The compressed backup may then be replicated (e.g., mirrored) to other backup storage devices in the backup storage system. The compression may reduce the amount of data being replicated between the backup storage devices.

Figure 2C:
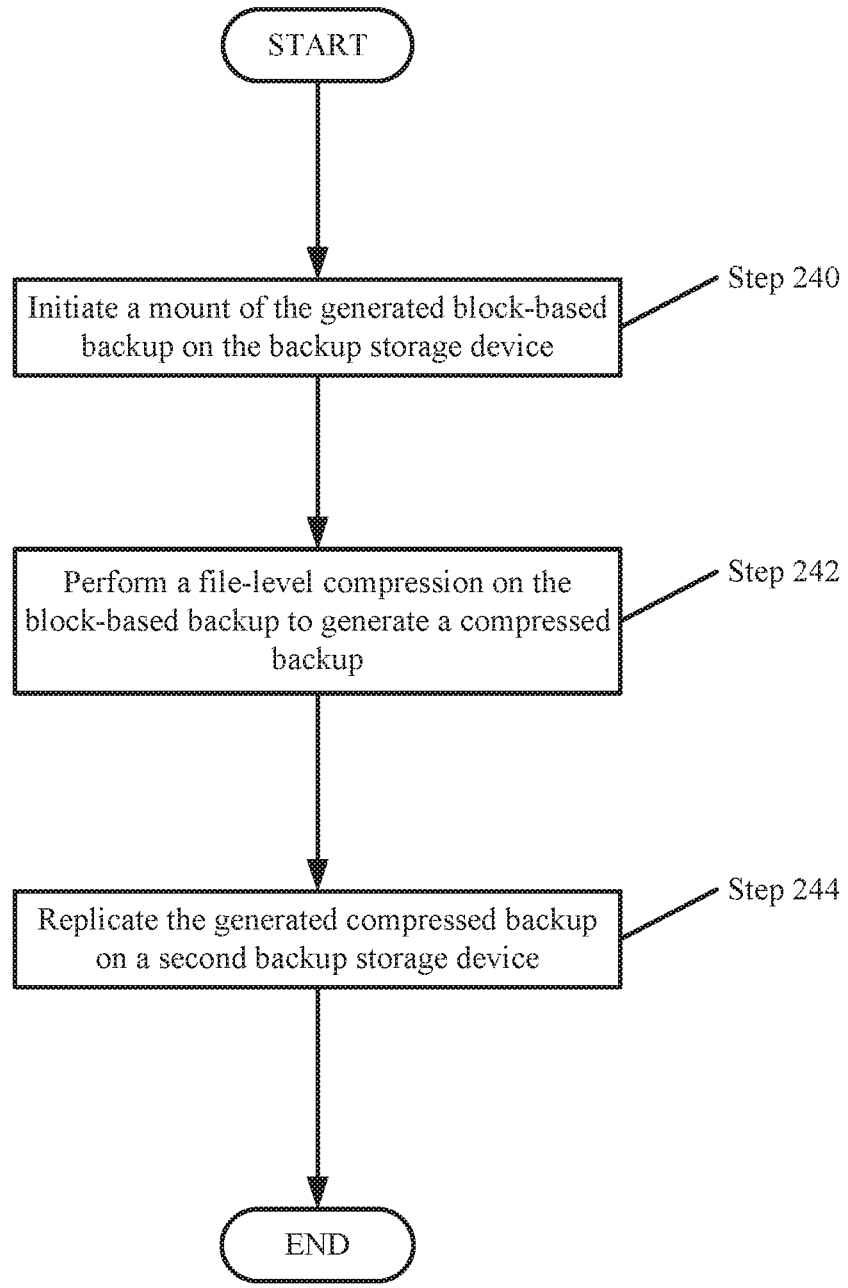
FIG. 2C shows a flowchart for initiating a compression and replication of the block in accordance with one or more embodiments of the invention.

In one or more embodiments of the invention, the compression and replication is initiated via the methods illustrated in FIG. 2C. The compression and replication is initiated via other methods without departing from the invention.

FIG. 2B shows a flowchart for performing a backup stream process in accordance with one or more embodiments of the invention.

In step 220, a file extent is selected from the backup stream.

In step 222, a determination is made about whether the selected file extent is present in the file extent map. If the selected file extent is present in the file extent map, the method proceeds to step 224; otherwise the method proceeds to step 226.

In step 224, a copy of data blocks associated with the selected file extent is generated using the source volume. In one or more embodiments of the invention, the copy is generated by identifying the portion of the source volume specified by the file extent and reading the data in the identified portion.

In one or more embodiments of the invention, the metadata associated with the file extent is copied as well. In other words, data that provides information about the copy of the data blocks may be sent to the backup storage device as well. The metadata may describe an offset of each block relative to the file associated with the data block. The process of copying the data blocks may include converting the metadata from file offsets (e.g., virtual cluster numbers (VCNs)) to offsets relative to the source volume (e.g., logical cluster numbers (LCNs)). Additional and/or different conversions may be applied to the metadata and/or data blocks without departing from the invention.

In step 226, a copy of data blocks associated with the selected file extent is generated using the template virtual volume. The data blocks may include no information about any files. In other words, the data blocks in the template virtual volume associated with the selected file extent may be little more than disk space that is used to fill the backup stream to a size similar to that of the source volume without including all of the data of the source volume. In one or more embodiments of the invention, the copy is generated by identifying the portion of the template virtual volume specified by the file extent and reading the data in the identified portion.

In step 228, the backup stream is updated using the copy of data blocks. In one or more embodiments of the invention, the backup stream is updated by including the copy of data blocks in the backup stream. The copy of data blocks may be copied from the source volume, as specified in step 224, or the copy may be copied from the virtual volume, as specified in step 226.

In step 230, the selected file extent is marked as processed.

In step 232, a determination is made about whether all file extents in the backup stream are processed. If all file extents in the backup stream are processed, the method proceeds to step 234; otherwise, the method proceeds to step 220.

In step 234, the backup stream is sent to the backup storage device as a block-based backup. In one or more embodiments of the invention, the backup stream sent to the backup storage device includes metadata that specify the data being sent to the backup storage device. The backup stream may be in VHD/VHDX format. The backup stream may be sent to the backup storage process in any other format without departing from the invention.

FIG. 2C shows a flowchart for initiating a compression and replication of the block-based backup in accordance with one or more embodiments of the invention.

In step 240, the generated block-based backup is mounted on the backup storage device. In one or more embodiments of the invention, the production host prompts the backup storage device to mount the block-based backup on the backup storage device. The backup may be mounted by generating a file system structure (e.g., a directory) for the contents of the block-based backup in order to provide access to the contents through the backup storage device's file system.

In one or more embodiments of the invention, the block-based backup is mounted using an operating system Application Programming Interface (API) that is executed on the backup storage device. The operating system (or another process executing on/in the operating system) analyzes the backup to identify the contents (e.g., files) stored in the backup and assigns the contents directories. The directories are incorporated into the file system used by the operating system by setting a mount point in which to mount the directories to the file system.

In one or more embodiments of the invention, the block-based backup is mounted using an Internet Small Computer Systems Interface (iSCSI). In one or more embodiments of the invention, the iSCSI is an Internet Protocol used by the backup storage devices in the backup storage system when communicating. The production host may send commands that follow the iSCSI protocol that request the backup storage device to mount the block-based backup. In this manner, other backup storage devices in the backup storage system may use the same language when identifying the block-based backup after it has been compressed and replicated to the other backup storage devices.

In step 242, a file-level compression is performed on the block-based backup to generate a compressed backup. In one or more embodiments of the invention, a file-level compression includes using a compression function provided by the operating system (or file system executing thereon). The compression function may identify data to be encoded and generate encoded portions of the data. Each encoded portion may be a portion smaller in size than the original portion of data. In the compressed backup, the encoded portions may replace the original portions of data.

In one or more embodiments of the invention, the original portions of data to be encoded include a repeating pattern of data generated using a page zeroing function. In one or more embodiments of the invention, a page zeroing function is a function that identifies deleted (or otherwise empty) data and writes over the data with either zeros or any other binary pattern. The compression function may identify files, or portions of files, in the block-based backup that have been written over with zeros or the binary pattern. The identified files, or portions of files, may be replaced with encoded portions of data of a smaller size. In this manner, the block-based backup is compressed using the compression function provided by the operating system.

In step 244, the generated compressed backup is replicated on a second backup storage device in the backup system. In one or more embodiments of the invention, the backup storage device transmits the compressed backup to a second backup storage device to increase the reliability of the backup storage system. In this way, the production host may retrieve the compressed backup from the second backup storage in the event of the first backup storage becoming inaccessible to the production host (e.g., due to backup storage failure).

Figure 2D:
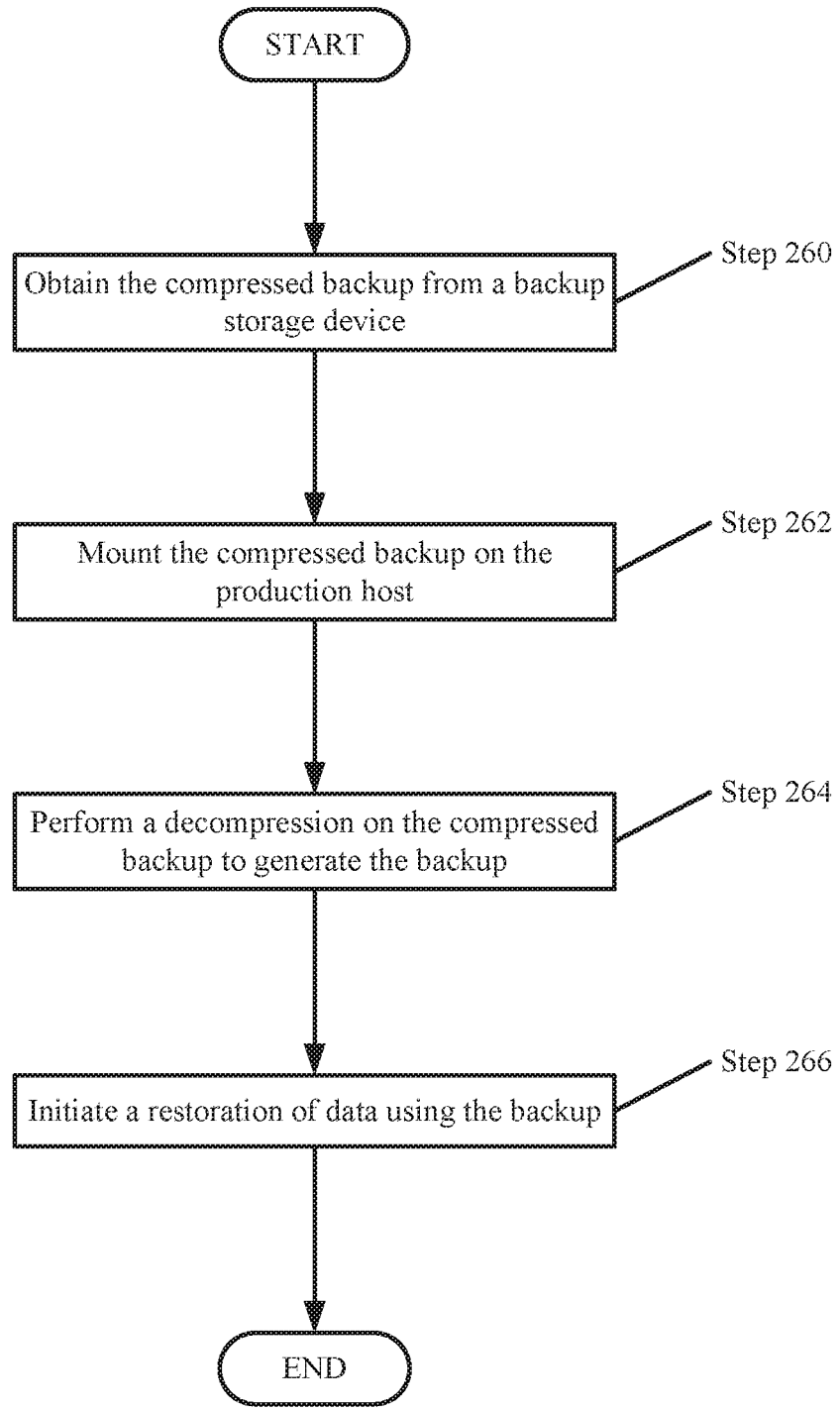
FIG. 2D shows a flowchart for recovering a backup in accordance with one or more embodiments of the invention.

FIG. 2D shows a flowchart for recovering a backup in accordance with one or more embodiments of the invention.

In step 260, the production host obtains the compressed backup from a backup storage device. The backup storage device may be any backup storage device from the backup storage system that stores the compressed backup. The backup storage device may have obtained the compressed backup either from the production host or replicated from another backup storage device.

In step 262, the compressed backup is mounted on the production host. In one or more embodiments of the invention, the compressed backup is mounted by using an operating system of the production host. The operating system of the production host may use an operating system API to identify the contents of the compressed backup and generate a directory for the contents. The API may determine a mounting point on a file system of the production host in which to incorporate the directory of the contents.

In step 264, decompression is performed on the compressed backup to generate the block-based backup. In one or more embodiments of the invention, the decompression is performed by identifying the encoded portions of the compressed backup. The production host may identify the encoded portions using the compression function applied to the compressed backup by the backup storage device. The encoded portions may be decoded to restore the portions to a state prior to being compressed.

In step 266, a restoration of data is initiated using the backup. The restoration may be performed using the operating system of the production host. The operating system may use the format (e.g., VHDx) of the block-based backup to identify metadata stored in the block-based backup. The metadata may be used to identify a set of files stored in the block-based backup. The files may subsequently be restored on the file system of the production host to be accessed by a user.

Example

The following section describes an example. The example is not intended to limit the invention.

Figure 3A:
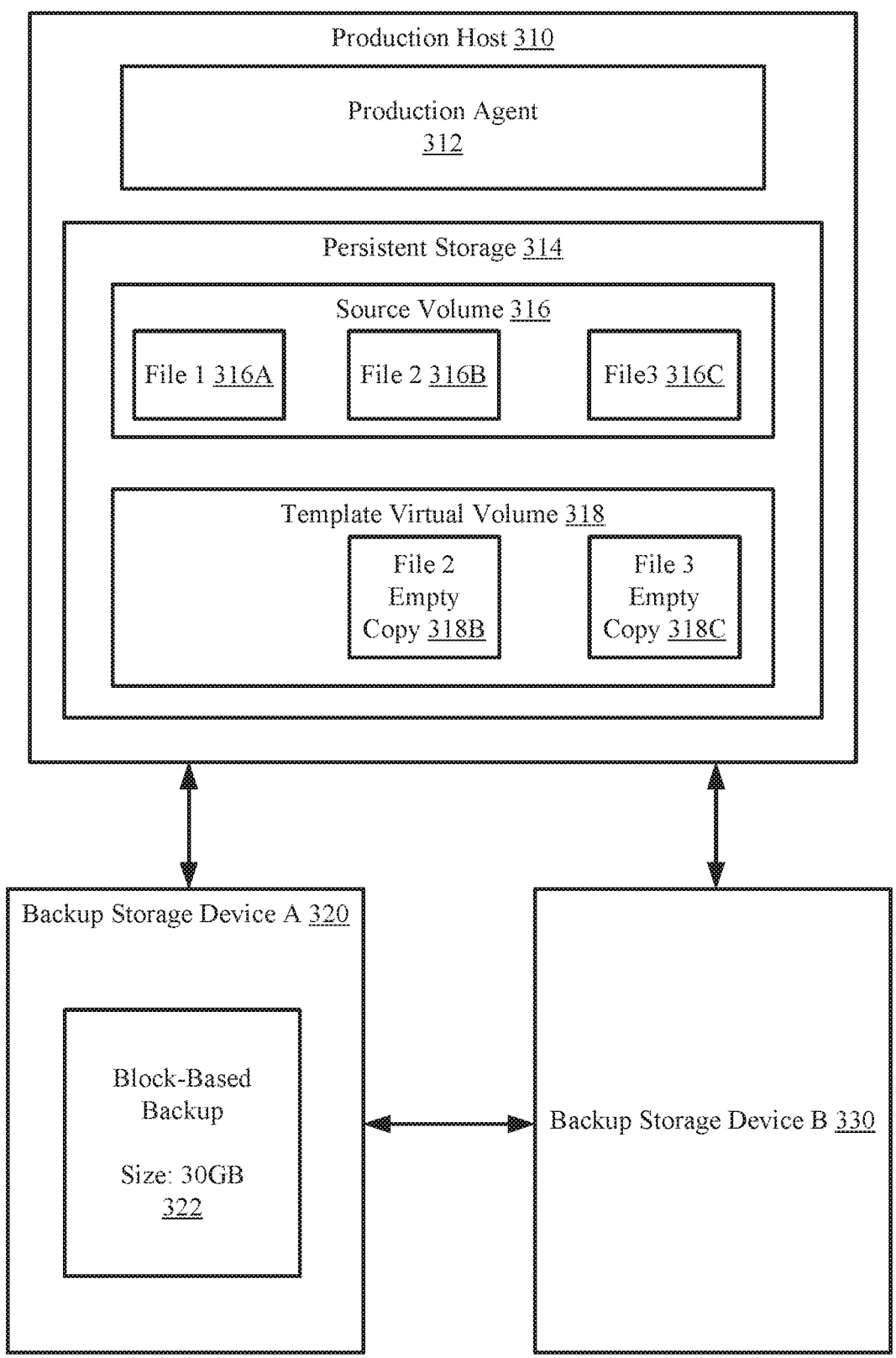
FIGS. 3A-3B show an example in accordance with one or more embodiments of the invention.

Consider a scenario in which a user requests to back up a subset of files stored in a production host to a backup storage system. FIG. 3A shows an example system that includes a production host (310) and two backup storage devices (320, 330). The production host (310) includes a production agent (312) that initiates and completes a backup of the subset of files stored in a source volume (316) as requested. The source volume (316) may store all of the files (316A, 316B, 316C) in the production host. The subset of files in to be backed up may include only files 2 and 3 (316B, 316C). The backup is generated by generating a template virtual volume (318) in which a portion of the template virtual volume is allocated to files 2 and 3 (318B, 318C).

The production host may perform the methods of FIGS. 2A-2B to stream the data associated with Files 2 and 3 (316B, 316C) to a backup storage device (320). The backup stream process may include identifying file extents associated with the subset of files to be backed up and reading from a backup stream that includes file extents of data stored in the production host. The production agent (312) may read data blocks associated with a file extent in the backup stream from the source volume if the file extent is associated with the subset of files. Otherwise, the production agent (312) may read from the template virtual volume. The data blocks may then be populated on the backup stream and sent to the backup storage device (320) as a block-based backup (322). In this example at least a portion of the files that are stored the backup storage device include zeros, which are the result of a page zeroing function being applied to at least a portion of the file.

After being stored in the backup storage device (320), the production host (310) may perform the methods of FIG. 2C to initiate a compression and replication of the block-based backup (322). The production host (310) may prompt the backup storage device A (320) to mount the block-based backup (322) on the backup storage device (i.e., insert a directory of the block-based backup into a file system of the backup storage device) and compress the backup by encoding portions of the block-based backup that include zeros due to the prior application of the page zeroing function. The encoded portions may be smaller in size than the portions prior to being encoded.

Figure 3B:
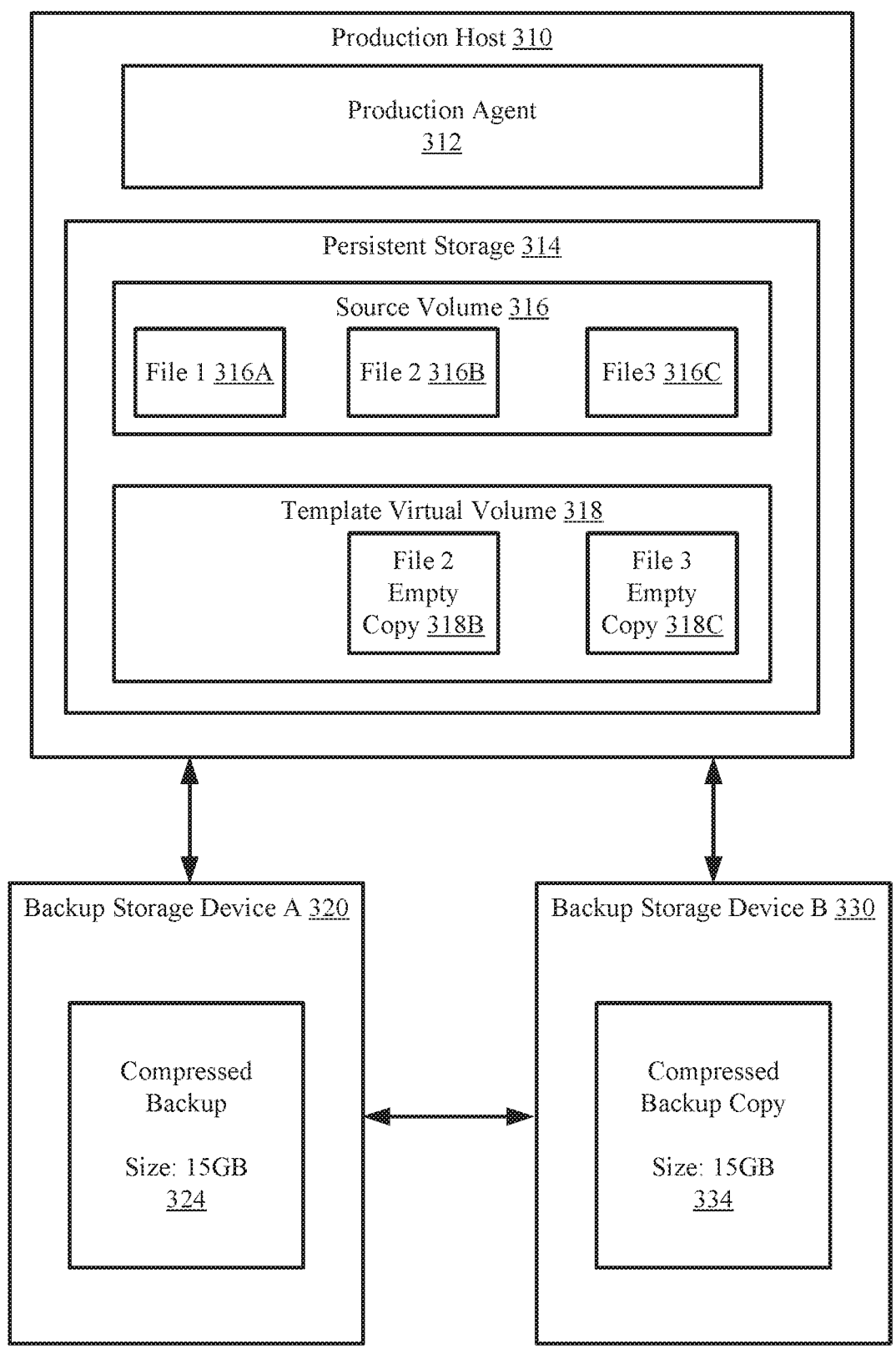

FIG. 3B shows the resulting system with a compressed backup (324) of a smaller size than the block-based backup (322). The compressed backup (324) may then be replicated to a second backup storage device (330).

At a later point in time, the production host may want to restore files 2 and 3 (316B, 316C) to a point in time associated with the compressed backup (334). The production host (310) may obtain a copy of the compressed backup (334) from the second backup storage device (330). The compressed backup (334) may be mounted on the production host (310) and decompressed using a decompression algorithm that restores portions of data to a point prior to being page-zeroed. The data from the de-compressed backup may be restored so that files 2 and 3 are accessible to the user from the production host.

End of Example

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

One or more embodiments of the invention may be implemented using instructions executed by one or more processors of the data management device. Further, such instructions may correspond to computer readable instructions that are stored on one or more non-transitory computer readable mediums.

One or more embodiments of the invention may improve the operation of one or more computing devices.

Embodiments of the invention improve the operation of one or more computing devices. Specifically, embodiments of the invention improve the replication of data between computing devices in a storage system. Embodiments of the invention reduce the amount of data sent between the computing devices by performing compression methods on the data so that the data takes less computing resources to replicate than before the compression.

Further, embodiments of the invention improve the operation of one or more computing devices by maintaining the deterministic nature of the data in a backup storage system. Specifically, in scenarios in which the data being backed up is subject to page zeroing, the use of file-level compression instead of block-based compression allows the compressed backups to maintain their deterministic nature during subsequent replication of backups while taking advantage of the compression functions provided by a file system. With page zeroing, a binary pattern or a series of zeroes is written in deleted regions of the data being backed up. Embodiments of the invention reduce the amount of data used by the binary patterns and/or series of zeroes by replacing the binary patterns and/or series of zeroes with smaller portions of data.

By backing up the block-based backup using mountable containers and compressing the data at a file level, embodiments of the invention reduce the amount of data to be replicated than without the file-level compression.

Thus, embodiments of the invention may address the problem of inefficient use of computing resources in a distributed computing environment. This problem arises due to the technological nature of the environment (e.g., page zeroing) in which backup services are implemented.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing backups, the method comprising:
   mounting a block-based backup on a backup storage system to obtain a mounted backup;
   compressing the mounted backup to generate a compressed backup; and
   replicating the compressed backup to generate a plurality of compressed backups,
   wherein the block-based backup comprises at least two instances of a repeating pattern generated using a page zeroing function.

2. The method of claim 1, further comprising:
   receiving the block-based backup from a production host operatively connected to the backup storage system.

3. The method of claim 1, wherein mounting the block-based backup comprises using an operating system Application Programming Interface (API), wherein the operating system is executing on the backup storage system.

4. The method of claim 3, wherein compressing the mounted backup comprises performing file-level compression on the mounted backup using a compression function provided by the operating system.

5. The method of claim 1, wherein compressing the mounted backup encodes the at least two instances of the repeating pattern to generate encoded portions in the compressed backup, wherein the encode portions are smaller than the corresponding at least two instances of the repeating pattern in the block-based backup.

6. The method of claim 1, wherein mounting the block-based backup comprises using an Internet Small Computer Systems Interface (iSCSI) protocol.

7. The method of claim 1, wherein compressing the mounted backup comprises performing file-level compression on the mounted backup.

8. A non-transitory computer readable medium comprising computer readable program code, which when executed by a computer processor enables the computer processor to perform a method for managing backups, the method comprising:
mounting a block-based backup on a backup storage system to obtain a mounted backup;
compressing the mounted backup to generate a compressed backup; and
replicating the compressed backup to generate a plurality of compressed backups,
wherein the block-based backup comprises at least two instances of a repeating pattern generated using a page zeroing function.

9. The non-transitory computer readable medium of claim 8, further comprising:
receiving the block-based backup from a production host operatively connected to the backup storage system.

10. The non-transitory computer readable medium of claim 8, wherein mounting the block-based backup comprises using an operating system Application Programming Interface (API), wherein the operating system is executing on the backup storage system.

11. The non-transitory computer readable medium of claim 10, wherein compressing the mounted backup comprises performing file-level compression on the mounted backup using a compression function provided by the operating system.

12. The non-transitory computer readable medium of claim 8, wherein compressing the mounted backup encodes the at least two instances of the repeating pattern to generate encode portions in the compressed backup, wherein the encode portions are smaller than the corresponding at least two instances of the repeating pattern in the block-based backup.

13. The non-transitory computer readable medium of claim 8, wherein mounting the block-based backup comprises using an Internet Small Computer Systems Interface (iSCSI) protocol.

14. The non-transitory computer readable medium of claim 8, wherein compressing the mounted backup comprises performing file-level compression on the mounted backup.

15. A system, comprising:
a processor;
a database;
memory comprising instructions which when executed by the processor perform a method, the method comprising:
mounting a block-based backup on the system to obtain a mounted backup;
compressing the mounted backup to generate a compressed backup; and
replicating the compressed backup to generate a plurality of compressed backups,
wherein the block-based backup comprises at least two instances of a repeating pattern generated using a page zeroing function and wherein compressing the mounted backup encodes the at least two instances of the repeating pattern to generate encode portions in the compressed backup, wherein the encode portions are smaller than the corresponding at least two instances of the repeating pattern in the block-based backup.

16. The system of claim 15, wherein the method further comprises:
receiving the block-based backup from a production host operatively connected to the backup storage system.

17. The system of claim 15, wherein mounting the block-based backup comprises using an operating system Application Programming Interface (API), wherein the operating system is executing on the backup storage system and wherein compressing the mounted backup comprises performing file-level compression on the mounted backup using a compression function provided by the operating system.

* * * * *